United States Patent [19]

Hamilton et al.

[11] Patent Number: 4,997,366

[45] Date of Patent: Mar. 5, 1991

[54] REAR WALL CONSTRUCTION FOR BURN-IN ENVIRONMENTAL SYSTEMS

[75] Inventors: Harold E. Hamilton, Minneapolis; Brian R. Bloch, Cedar, both of Minn.

[73] Assignee: Micro Control Company, Minneapolis, Minn.

[21] Appl. No.: 474,385

[22] Filed: Feb. 5, 1990

[51] Int. Cl.⁵ ............................................ F27D 1/00
[52] U.S. Cl. ................................ 432/247; 307/149; 110/336; 432/251
[58] Field of Search ............... 432/247, 248, 249, 251, 432/242; 110/336

[56] References Cited

U.S. PATENT DOCUMENTS

| | | | |
|---|---|---|---|
| 2,985,442 | 5/1961 | Hilber | 432/247 |
| 3,790,340 | 2/1974 | Isaksson et al. | 432/251 |
| 3,802,833 | 4/1974 | Weber | 110/336 |
| 4,900,948 | 2/1990 | Hamilton | 307/149 |
| 4,910,063 | 3/1990 | Holland et al. | 110/336 |

Primary Examiner—Henry C. Yuen
Attorney, Agent, or Firm—Kinney & Lange

[57] ABSTRACT

A rear module wall before a burn-in system that provides burn-in boards for electronic components to permit passing connections through slots while maintaining a good heat seal. The module rear wall is a sandwich type construction of a plurality of layers with insulating silicon rubber sandwiched between slotted backing sheets to provide for double insulation for the boards as then are slid through the slots from the interior of the oven into a tempered zone or to the exterior where they are connected to driver receiver boards and other connections.

4 Claims, 2 Drawing Sheets

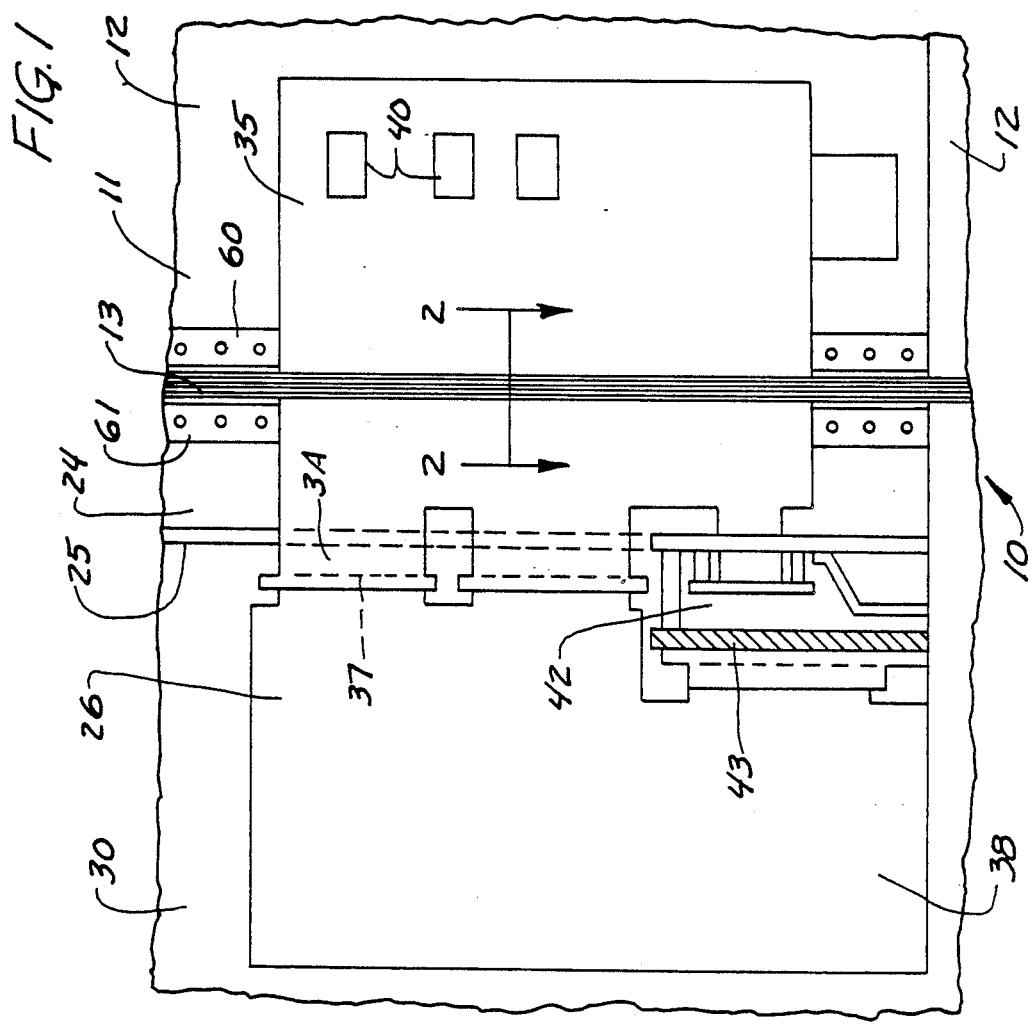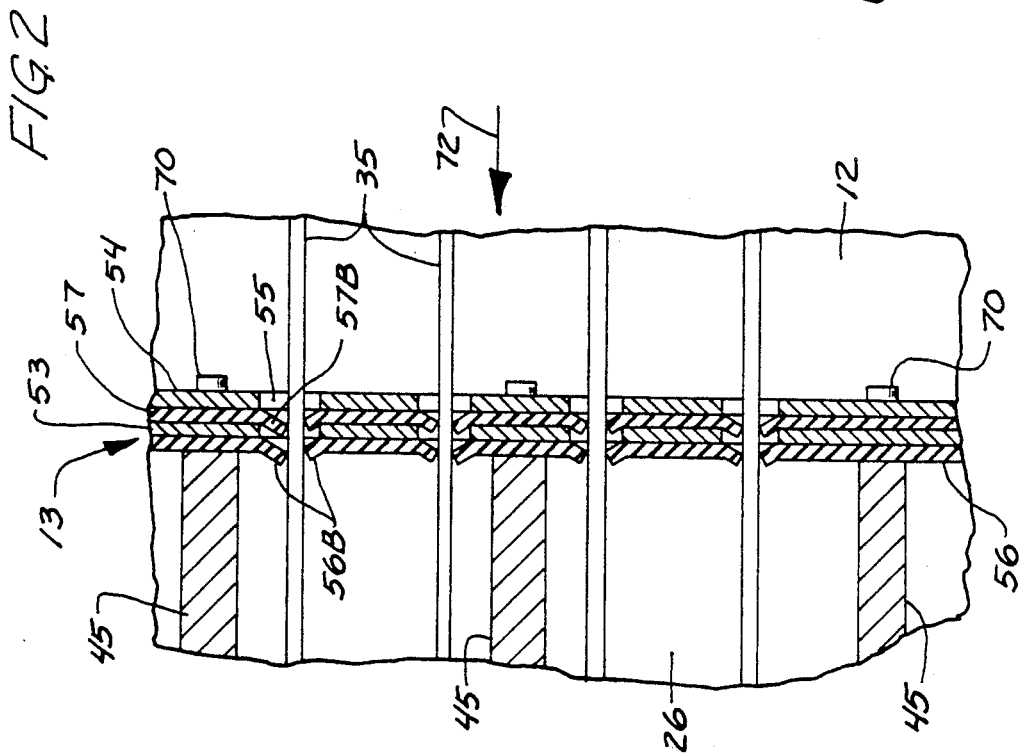

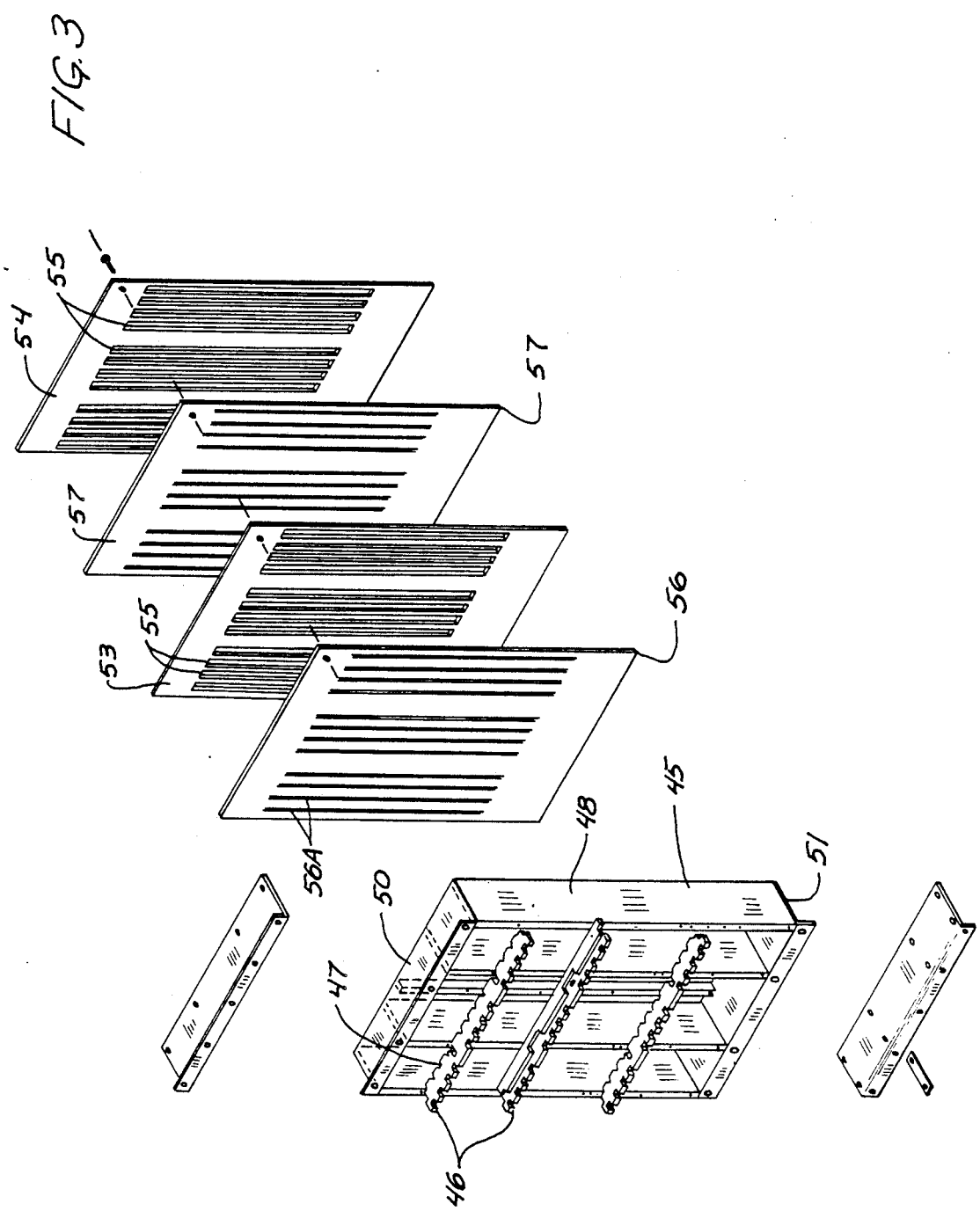

REAR WALL CONSTRUCTION FOR BURN-IN ENVIRONMENTAL SYSTEMS

BACKGROUND OF THE INVENTION

The present invention relates to a wall construction for a burn-in board environmental chamber or oven, which permits passing boards from the heated, high temperature zone into a temperate or exterior zone and providing for extra insulation and sealing.

U.S. Pat. No. 4,900,948, issued Feb. 13, 1990, shows a device or burn-in of integrated circuits and illustrates an environmental chamber or oven that has boards passing through a temperate or lower temperature zone before final connection to the exterior driver-receiver boards that are used for the burn-in process. The boards extend through slots in the oven or environmental chamber wall from the interior, across the temperate chamber and through slots in the second wall to the exterior. The connections are all standard, but high heat loss from the high temperature oven to the exterior occurs. This is undesirable, both from the stand point of cost of heating and from the need for dissipating any heat that escapes from the oven.

The devices shown in U.S. Pat. No. 4,900,948 are acknowledged as prior art to the invention of the present application.

SUMMARY OF THE INVENTION

The present invention relates to providing a sealing arrangement for environmental systems, to permit passing flat printed circuit (PC) boards through provided slots in one wall of the system from the high temperature chamber to the exterior. The edges of the boards, which extend through the slots, are connected to slots for burn-in of components that are mounted on the board in the high temperature chamber.

The high temperature seal comprises a sandwich or laminated construction of at least two resilient sheets that sandwich with backing panels that have slots in them. The resilient sheets are slit, so that the boards can be slipped through the slots and the edges of the slits in the resilient sheets will deflect to provide a lip type seal on the side surfaces of the board to tend to prevent the escape of heat. The double seal greatly increases the insulation qualities, and prevents excessive loss of heat. The use of two flexible lip seals in series provides a great advantage in reducing energy losses. The seal arrangement is very effective in reducing conductive losses by doubling the R factor, and in reducing infiltration losses by providing extra sealing surfaces or edges for efficient operation.

BRIEF DESCRIPTION OF THE DRAWINGS

FIG. 1 is a fragmentary schematic side elevational view of a typical environmental system having a wall made according to the present invention installed thereon;

FIG. 2 is a fragmentary enlarged sectional view taken on line 2—2 in FIG. 1; and FIG. 3 is a exploded view of a typical module wall assembly made according to the present invention.

DETAILED DESCRIPTION OF THE PREFERRED EMBODIMENTS

In FIG. 1, a schematic representation of an environmental burn-in board system is indicated generally at 10, and has a housing 11 that has side walls 12A (only one is shown and reference is made to prior U.S. Pat. No. 4,900,948 for further construction details). This defines an interior burn-in chamber 12 which is a heated environmental chamber surrounded by the side walls 12. There is a conventional front loading door (not shown) for the chamber 12 and the chamber is further defined by a rear wall module 13. In this construction, the rear wall module is used to separate a temperate zone chamber 24 from the very hot environmental burn-in chamber or oven 12.

The temperate zone housing 24 forms a convection zone from the chamber 12 from a driver-receiver board chamber 26, which is made up of an exterior card cage or rack, that suitably mounts on driver-receiver boards, and which is formed by side walls 30.

In operation, a plurality of printed circuit burn-in boards 35 are suitably supported so that the board planes extend vertically, as shown, on the interior of the heated chamber 25, and pass through the rear wall module 13, through slots in the rear wall made according to the present invention. The boards extend across the temperate zone chamber 24, and have edge connectors indicated schematically in dotted lines at 37 that protrude through the wall 25 to the exterior driver-receiver board chamber 26, in which driver-receiver boards 38 are mounted in a suitable manner. The edge connectors are standard, and connect components on the driver-receiver boards to the outer end portion shown at 35A of the burn-in boards 35. The connector connect the circuit modules shown schematically and typically at 40 on the burn-in boards to components on the driver-receiver boards.

Suitable auxiliary boards such as those shown at 42 can be provided for providing connection to power components on the burn-in boards across a conventional back plane 43, as more fully explained in U.S. Pat. No. 4,900,948.

Referring to FIG. 3, it can be seen that the rear wall assembly 13 is made up of a housing 45 that has a plurality of board alignment guides 46 thereon for aligning and holding the driver boards. The guides 46 have alignment grooves 47 on opposite sides thereof for receiving the outer edges of the burn-in boards and aligning them so that proper connections can be made. The housing 45 includes a plurality of vertical bars 48 that are spaced apart and are fastened to the alignment guides 46 to be held in assembly, and which include top and bottom plates 50 and 51, that also hold the unit together. The wall assembly 13 itself is of a sandwich construction having a pair of relatively rigid flat backing sheets 53 and 54 that are provided with elongated slots 55, that are fairly wide, as can be seen, and are arranged in a desired orientation so that they will receive the vertically oriented burn-in boards. A pair of silicone rubber seal sheets indicated at 56 and 57 are then put into a laminated or sandwich construction. Each of the sheets 56 and 57 has a plurality of slits, as indicated at 56A on sheet 56 and at 57A on sheet 57, that are in alignment with the slots 55 in the backing sheets 53 and 54. The slits are merely slits in the material, and when they are aligned with the slots 55, which are wider than the slits, and the unit is made into a laminated or layered structure, the edges of the slits will have to yield out of the way when the burn-in boards are passed through the slots 55 of the wall module 13.

The sandwich construction is made by placing the sheet 56 up against the edges of the support bars 45, and then clamping the sheet 56 by in turn clamping a backing sheet 53, resilient or elastomeric seal sheet 57, and the sheet 54 together and holding them in position clamped together with suitable screws or fasteners that pass through these sheets and engaged the seal support bars. Additionally, the support sheets can be supported by using suitable brackets 60 and 61 as shown in FIG. 1, to tend to clamp the edges. Similar brackets can be used along the top and the bottom where they will clear the burn-in boards 35. The sheets 53 and 54 can be stainless steel, fiberglass, a polyimide or other rigid, high temperature tolerant material.

As shown in FIG. 2, two of the support bars 45 are shown clamped against the resilient sheet 56 with the sandwich construction of the next sheet 53, the next elastomeric or rubber seal sheet 57, and the inner sheet 54 is shown. Fasteners indicated at 70 can be used for clamping the individual sheets against the edges of the seal support bars, for holding the seals and the backing sheets in assembly. It can be seen that when the burn-in boards indicated at 35 are slipped through the slots 55 and separate the slits 56A and 57A, the edges defining the slits form lip portions that tend to yield out of the way, and generally as shown at 56B. The slits in the sheet 57 also tend to yield as shown at 57B, and more or less protrude into the adjacent slot 55 of the sheet 53 when the burn-in boards are slid into position and direction is indicated by arrow 72.

The arrangement shown provides a double insulation seal. Insulation material can not be added in the temperate zone, and the present sandwich construction of a double elastomeric seal sheet having slits there and reduces substantially conductive losses, infiltration type losses, and the R factor itself is doubled. Preferably the resilient seal sheets are made of a silicone rubber that will withstand the heat on the internal hot chamber 12, and because of the greater insulating qualities and the greater amount of air seal, higher efficiencies are achieved.

The size of the slots 55 can be regulated so that their width is sufficient to permit small lip portions such as that shown at 56B and 57B to yield, and provide a good edge seal against the side surfaces of the burn-in boards 35 that are slid into position. The silicone rubber sheets and rigid backing sheets are about 0.060 inches thick.

The same type of double seal wall can be used for units that do not have a temperature chamber at the back wall of the environmental system, and in situations where no temperate zone is provided, the double seal arrangement continues to be exceptionally effective in reducing heat losses.

Although the present invention has been described with reference to preferred embodiments, workers skilled in the art will recognize that changes may be made in form and detail without departing from the spirit and scope of the invention.

What is claimed is:

1. An environmental chamber system having at least one wall provided with apertures therein for receiving generally flat printed circuit boards that pass through such apertures, the exterior of the apertures being at a reduced temperature from the interior of a burn-in chamber of the system and said wall comprising a laminated construction of at least two sheet layers of resilient flexible material having slits therein, and a backing sheet of material having slots that are wider than the slits and are sized to receive the flat boards passing therethrough with clearance along the edges of the slots, said two layers of flexible material providing a double lip seal along the side surfaces of the boards where the boards pass through the slots.

2. The apparatus as specified in claim 1 wherein there are at least two of the backing sheets supporting the flexible sheets having the slits therein, each of said backing sheets having slots that align for receiving boards passing therethrough.

3. The apparatus as specified in claim 2 and means to support an exterior one of the flexible sheets along surfaces thereof adjacent at least some of the slits.

4. The apparatus as specified in claim 2 wherein said laminated construction has one backing sheet on the surface of the one wall facing the interior of the environmental chamber.

* * * * *